United States Patent
Shelby et al.

(10) Patent No.: US 6,775,297 B1
(45) Date of Patent: Aug. 10, 2004

(54) COMPUTER-BASED CONVERSION OF DIGITAL SIGNALS

(76) Inventors: James C. Shelby, 1141 Joliet St., Aurora, CO (US) 80010; Thomas D. McKay, 13920 Telluride Dr., Broomfield, CO (US) 80020; Robert G. Pecina, 452 W. Griffith St., Louisville, CO (US) 80027

( * ) Notice: Subject to any disclaimer, the term of this patent is extended or adjusted under 35 U.S.C. 154(b) by 0 days.

(21) Appl. No.: 09/553,998

(22) Filed: Apr. 20, 2000

Related U.S. Application Data

(63) Continuation of application No. 07/999,317, filed on Dec. 31, 1992, now abandoned.

(51) Int. Cl.[7] .................................................. H04J 3/22

(52) U.S. Cl. ..................................... 370/466; 375/222

(58) Field of Search .......................... 375/222; 370/466

(56) References Cited

U.S. PATENT DOCUMENTS

| | | | |
|---|---|---|---|
| 4,663,759 A | 5/1987 | Mukaemachi et al. | 370/525 |
| 4,694,456 A | 9/1987 | Morita et al. | 714/763 |
| 5,134,611 A | 7/1992 | Steinka et al. | 370/466 |
| 5,315,595 A | 5/1994 | Allouis et al. | 370/421 |
| 5,319,634 A | 6/1994 | Bartholomew et al. | 370/441 |
| 5,375,118 A | 12/1994 | Rao et al. | 370/401 |
| 5,394,439 A | 2/1995 | Hemmati | 375/242 |
| 5,450,412 A | 9/1995 | Takebayashi et al. | 370/463 |

*Primary Examiner*—Kenneth R. Coulter
(74) *Attorney, Agent, or Firm*—Townsend and Townsend and Crew LLP

(57) ABSTRACT

An apparatus for transforming digital data into encoded digital data describing analog signals representing the digital data. The apparatus comprises a CPU, memory, and control logic for the data translation. The control logic of the apparatus employs mathematical formulae to produce encoded digital data which describes the characteristics of analog signals representing digital data without converting the digital data into analog signals. The apparatus further performs the function of transforming encoded digital data describing analog signals representing digital data into digital data.

16 Claims, 5 Drawing Sheets

COMPUTER-BASED CONVERSION OF DIGITAL SIGNALS

This application is a continuation of U.S. patent application Ser. No. 07/999,317 titled "System for Converting Communication Signals" to Shelby et al. filed Dec. 31, 1992, now abandoned, which is expressly incorporated herein by reference in its entirety.

TECHNICAL FIELD

This invention relates generally to telecommunication systems, and more specifically to systems that convert communication signals for transmission between interconnected computers.

BACKGROUND ART

Traditionally, data transmission between two interconnected computers was accomplished through the use of analog telecommunication lines. Data communication over analog telecommunication lines could be accomplished by converting digital data into analog signals prior to transmission and converting the analog signals back into digital data upon receipt of the transmission.

The digital/analog conversion function is typically accomplished through a modulator/demodulator (MODEM). Thus, installing a first MODEM between the sending computer and the analog telecommunication line and a second MODEM between the analog telecommunication line and the receiving computer allows digital data to be transmitted using analog signals.

Recent advances in telecommunication technology have made it possible for telecommunication service providers to offer transmission lines which can facilitate the transmission of digital data. Digital data transmissions can be faster, more reliable and error-free than analog transmissions.

There are a number of types of digital telecommunication lines presently offered by telecommunication service providers. One type of telecommunication line that supports the transmission of digital data is commonly referred to in the industry as an integrated services digital network (ISDN) line.

In order to take advantage of an available digital telecommunication line, a computer must be adapted to provide a connection between the computer and the digital telecommunication line. Typically, this connectivity is achieved through the use of a personal computer terminal adapter (PCTA) which allows digital data to be input to and output from the computer.

In order to integrate the digital telecommunication lines into the existing system of analog transmission lines, telecommunication service providers implemented switching stations. These switching stations route transmissions to the appropriate lines and perform a translating function for transmission between analog and digital lines.

The translating function is performed using a Coder/Decoder (CODEC). To translate analog signals into digital data, for example, a CODEC receives analog signals transmitted along an analog telecommunication line, creates a coded digital representation of the analog signals, and transmits the coded digital representation of the analog signals along a digital telecommunication line.

There are several standard encoding schemes presently utilized to translate analog signals representing digital data into encoded digital data describing the analog signals representing digital data. The Mu law, ADPCM and the A law are examples of conversions methods well known in the art which are capable of performing such a translation.

Conversely, when data is being transmitted along a digital telecommunication line to be received using an analog telecommunication line, the switching station via the CODEC performs the reverse translation, namely converting coded digital data into analog signals.

Although switching stations facilitate the transmission of data between analog and digital telecommunication lines, the format of the coded digital data created by a CODEC is not compatible with standard computers. Consequently, a computer directly connected to a digital telecommunication line could not utilize the coded digital data without additional hardware.

Presently, a computer receiving coded digital data from a digital telecommunication line requires a second CODEC to decode the coded digital data to create an analog signal for transmission to a MODEM.

FIG. 1 illustrates the equipment currently necessary for data transmission between a standard personal computer and a public switched network using an analog telecommunication line. The digital data transmitted by the personal computer 100 via the data port 108 will hereinafter be referred to as application data.

In FIG. 1, a personal computer 100, having a keyboard 102, a monitor 104, a data port 108 and a program 106 capable of communicating with the data port 108 is attached to a MODEM 110. The MODEM 110 is connected to an analog telecommunication line 112 which is connected to a public switched network 114. The public switched network 114 has an attached CODEC 116 which can connect the analog telecommunication line 112 to a digital telecommunication line 118.

Application data to be transmitted from the personal computer 100 through the public switched network 114 is first passed from the program 106 through the data port 108 to the MODEM 110. The MODEM converts the digital data into analog signals capable of being transmitted along the analog telecommunication line 112.

The analog signals are routed by the public switched network 114 to the CODEC 116 which creates coded digital data representing the analog signals. The CODEC 116 transmits the coded digital data representing the analog signals out of the public switched network 114 along the digital telecommunication line 118.

Although the data transmission described above originates at the personal computer 100 and terminates after the coded digital data passes through the digital telecommunication line 118, data transmissions in the reverse direction are similarly accommodated. Regardless of the direction of the data transmission, the digital telecommunication line 118 carries coded digital data representing analog signals and the analog telecommunication line 112 carries analog signals.

FIG. 2 illustrates the equipment currently necessary for data transmission between a personal computer having an attached MODEM and CODEC and a public switched network using a digital telecommunication line.

In FIG. 2, a personal computer 200, having a keyboard 202, a monitor 204, a data port 208 and a program 206 capable of communicating with the data port 208 is attached to a MODEM 210. The MODEM 210 is connected to a terminal adapter (TA) 212. The TA 212 has an attached CODEC 214. The TA 212 is connected to a digital telecommunication line 216 which is connected to a public switched network 218.

Application data to be transmitted from the personal computer 200 through the public switched network 218 is first passed from the program 206 through the data port 208 to the MODEM 210. The MODEM converts the digital application data into analog signals capable of being transmitted along an analog telecommunication line.

The analog signals are transmitted from the MODEM 210 to the CODEC 214 attached to the TA 212. The CODEC converts the analog signals into coded digital data representing the analog signals. The coded digital data is transmitted from the TA 212 along the digital telecommunication line 216 to the public switched network 218.

After the public switched network 218 receives the coded digital data representing analog signals, the data can be transmitted out of the public switched network 218 using either a second digital telecommunication line or an analog telecommunication line with an attached CODEC as illustrated in FIG. 1.

Although the data transmission described above originates at the personal computer 200 and terminates after the coded digital data passes through the public switched network 218, data transmissions in the reverse direction are similarly accommodated. Regardless of the direction of the data transmission, the digital telecommunication line 216 carries coded digital data representing analog signals.

FIG. 3 illustrates the equipment currently necessary for data transmission between a personal computer having a TA with a rate adapter (RA) and a public switched network using a digital telecommunication line.

In FIG. 3, a personal computer 300, having a keyboard 302, a monitor 304, a TA 306 with an attached RA 308 and a program 310 capable of communicating with TA 306 is attached to a first digital telecommunication line 312. The rate adapter is a device known in the art for transmitting and receiving the bits of a low speed bit stream using a higher speed communication channel. The digital telecommunication line 312 is connected to a public switched network 314.

The public switched network 314 includes a terminal adapter 316 with an attached rate adapter 318, a MODEM 320, a CODEC 322 and a second digital telecommunication line 324.

Application data to be transmitted from the personal computer 300 through the digital telecommunication line 324 is first passed from the program 310 through the TA 306 and attached rate adapter 308 to the first digital telecommunication line 312. The digital data transmitted along the digital telecommunication line 312 is in a digital format adapted to flow at a rate compatible with both rate adapter 318 and rate adapter 308.

The digital data is received by the public switched network 314 and transmitted to terminal adapter 316 having rate adapter 318. Terminal adapter 316 utilizing rate adapter 318 converts the rate adapted digital data into digital data typically transmitted through an analog MODEM.

The digital data typically transmitted through an analog MODEM is transmitted from terminal adapter 316 to MODEM 320 which converts the digital data into analog signals. MODEM 320 transmits the analog signals to CODEC 322 which creates coded digital data representing the analog signals. CODEC 322 then transmits the coded digital data out of the public switched network 314 through digital telecommunication line 324.

Although the data transmission described above originates at the personal computer 300 and terminates after the coded digital data passes through the digital telecommunication line 324, data transmissions in the reverse direction are similarly accommodated. Regardless of the direction of the data transmission, the digital telecommunication line 312 carries rate adapted digital data, digital telecommunication line 324 carries coded digital data representing analog signals.

As illustrated by FIGS. 1–3, MODEMs and CODECs are currently necessary to accommodate the variety of telecommunication line types and digital transmission formats presently in use. MODEMS and CODECs are used both in conjunction with a communicating computer and within public switched networks.

Switching stations in public switched networks typically manage a large number of analog and digital telecommunication lines. Each switching station, therefore, requires a number of MODEMs and CODECs in order to convert between analog signals and coded digital data. These groups of MODEMs and CODECs within a public switched network are commonly referred to as MODEM pools.

A large number of MODEMs and CODECs are presently required by computers and public switched networks and data communications through public switched networks is increasing. A need, therefore, exists for a device which will directly convert between data typically transmitted through an analog MODEM and analog signals encoded for transmission over a digital telecommunication network, thus eliminating the need for additional special purpose hardware.

SUMMARY OF THE INVENTION

An object of the present invention is to provide an apparatus for transforming application data typically transmitted between applications through an analog MODEM into digital data encoded for transmission over a digital telecommunication network representing analog signals carrying application data. This conversion is typically performed using special purpose hardware. The present method and apparatus, however, employs control logic in conjunction with a computer for more efficient and cost-effective transmission than prior art solutions.

Another object of the present invention is to provide an apparatus for more efficiently using a digital telecommunication network which transforms analog signals into a format capable of being interpreted by control logic without necessitating additional hardware.

The foregoing objects are realized and a technical advance is achieved by the present invention. The apparatus of the present invention consists of a computer having a processor and memory. The computer must also have control logic and a communications interface device for transmitting and receiving application data. The control logic of the computer is used to transform application data typically transmitted between applications using an analog MODEM to and from digital data encoded for transmission over a digital telecommunication network representing analog signals carrying application data.

The apparatus of the present invention comprises the communications hardware, memory, CPU and control logic to receive input of digital data encoded for transmission over a digital telecommunication network describing analog signals representing application data and to transform or interpret said input as representative of application data in order to recover the application data.

The apparatus also comprises the communications hardware, memory, CPU and control logic to receive application data typically transmitted between applications through an analog MODEM and convert the data directly into digital data encoded for transmission over a digital telecommunication network describing analog signals representing application data.

The advantages accruing to the apparatus are apparent. In implementations which would presently require a MODEM and CODEC to facilitate data transmission, the apparatus of the present invention would eliminate the need for this additional hardware. Thus, the present invention performs the functions currently performed by a CODEC and a MODEM.

In some implementations, eliminating a MODEM avoids the use of limited expansion slots in a computer and allows the extra expansion slot to be used by additional resources. In addition, because employing the control logic allows data transmissions to flow directly between the communications interface device and the computer, the transmission is more efficient.

The advantages of the present invention are also apparent with respect to implementations which utilize a MODEM pool. Using the method and apparatus of the present invention in conjunction with a switching station (i.e. a central office or a private branch exchange), a MODEM pool could be eliminated. In addition, a variety of MODEM types could be represented in such an implementation. Furthermore, the functionality of the apparatus could be easily altered for a multitude of users simply by updating the control logic at the switching station.

DETAILED DESCRIPTION OF THE BEST MODE

Figure 4:
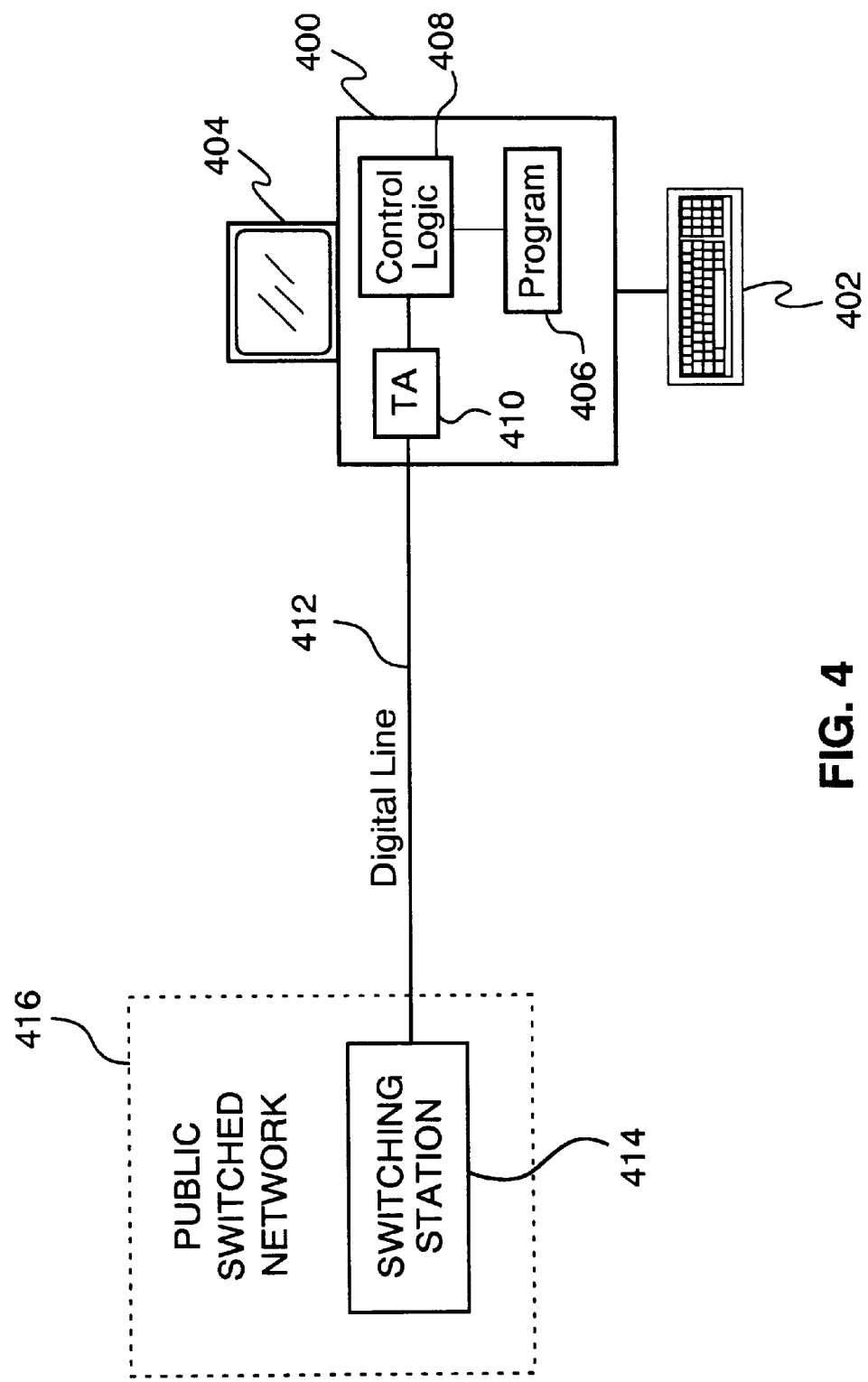
FIG. 4 is a functional block diagram illustrating an implementation of the present invention in a computer having a TA connected to a digital telecommunication line.

In order to simplify the description of the present invention, it will be described in connection with two specific examples. FIG. 4 is a functional block diagram describing the first example and illustrates an implementation of the present invention in a computer having a terminal adapter connected to a digital telecommunication line.

In FIG. 4, a computer 400, having a keyboard 402, a monitor 404, a program 406, control logic 408 and a terminal adapter 410 is connected to a digital telecommunication line 412. The digital telecommunication line 412 is connected to a switching station 414 within a public switched network 416.

Application data to be transmitted from the personal computer 400 through the public switched network 416 is passed from the program 406 to the control logic 408. The control logic 408 converts the digital application data into encoded digital data describing analog signals representing the digital application data. The encoded digital data is received by the terminal adapter 410 and passed along the digital telecommunication line 412 to the switching station 414 within the public switched network 416.

Figure 2:
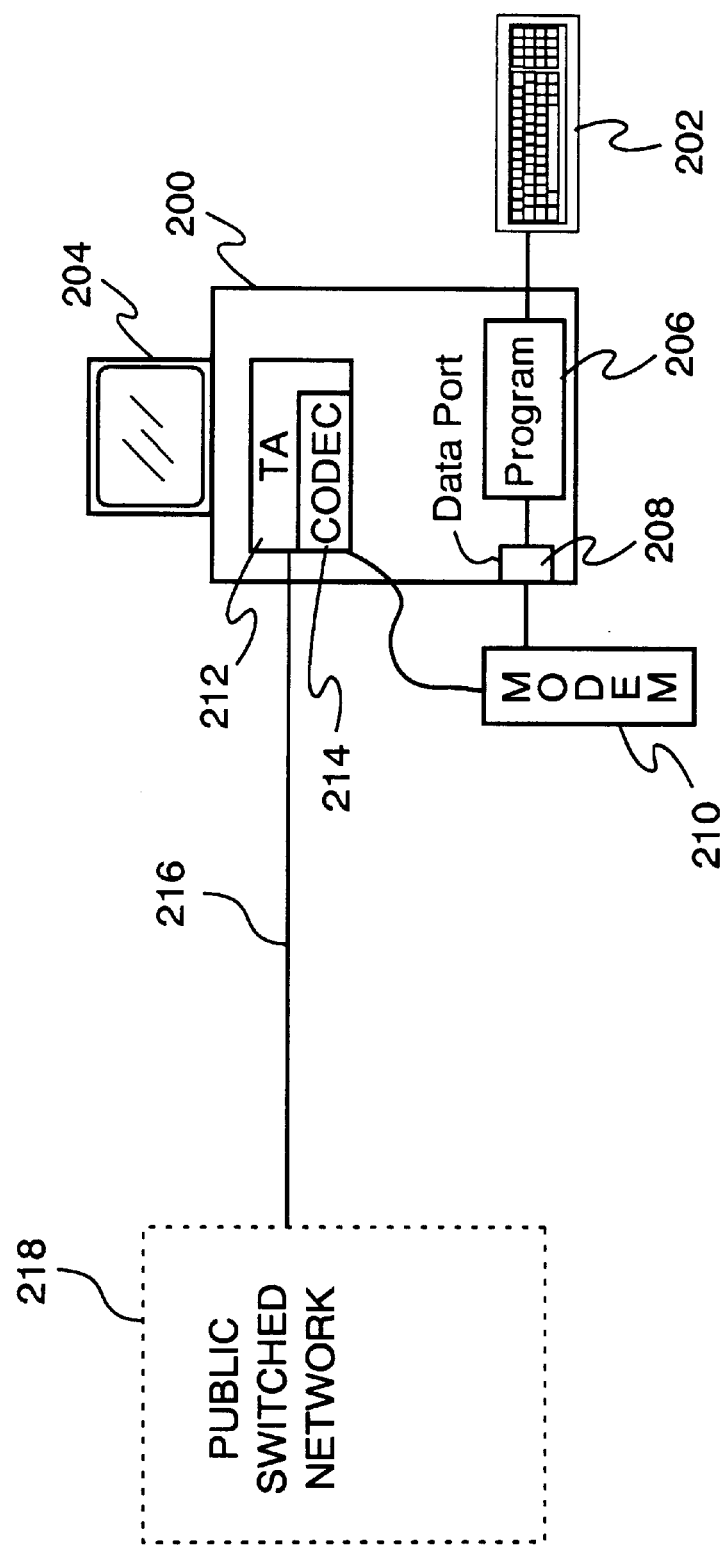
FIG. 2 is a functional block diagram illustrating the equipment currently necessary for a computer having a MODEM, TA and CODEC attached to a digital telecommunication line to send and receive application data over a public switched network.
Figure 3:
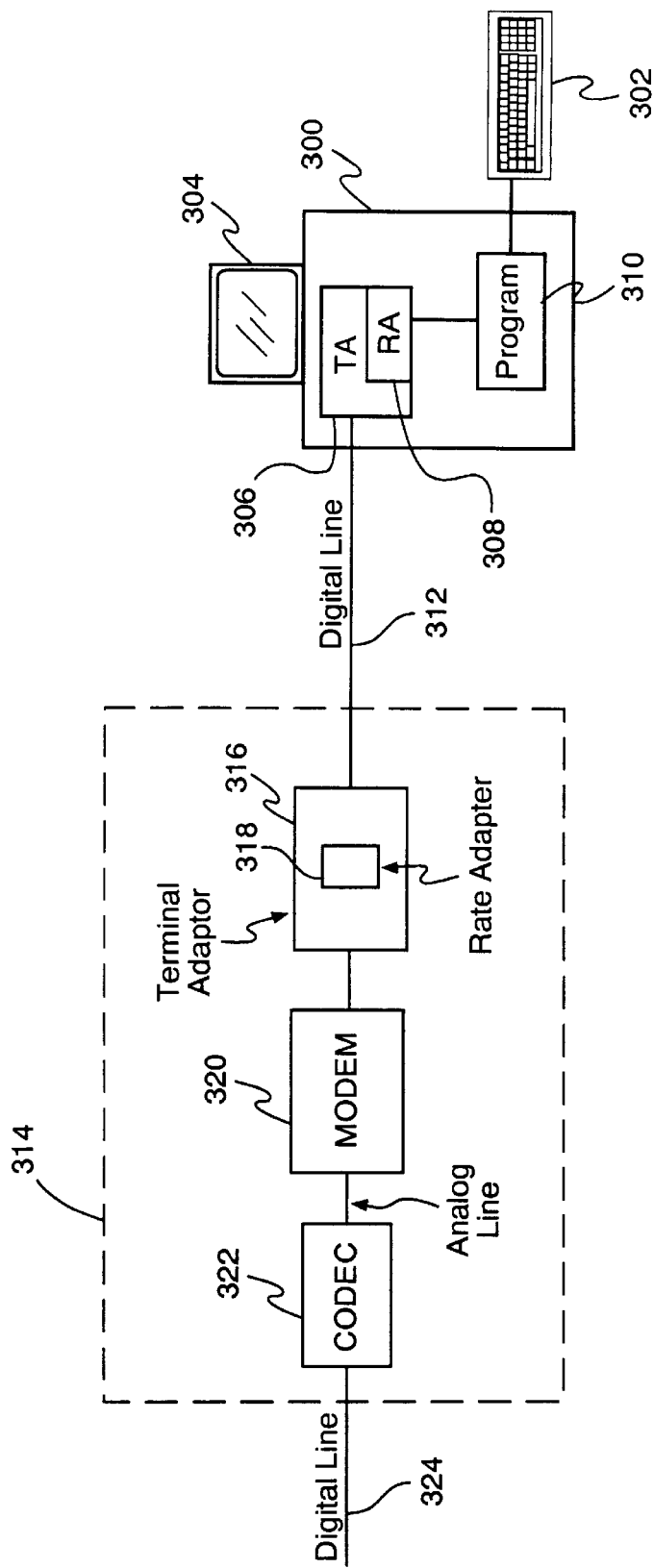
FIG. 3 is a functional block diagram illustrating the equipment necessary to communicate data between a computer having a TA with a rate adapter attached to a digital telecommunication line to send and receive application data over a public switched network.

Comparing FIG. 4, illustrating the present invention, to FIG. 2, illustrating the prior art, it can be seen that implementing the present invention in this example eliminates the need for the MODEM 210 and CODEC 214. Furthermore, in prior art solutions which utilize an internal MODEM in a personal computer, an expansion slot used by the internal MODEM would be available if the apparatus of the present invention is implemented.

Figure 1:
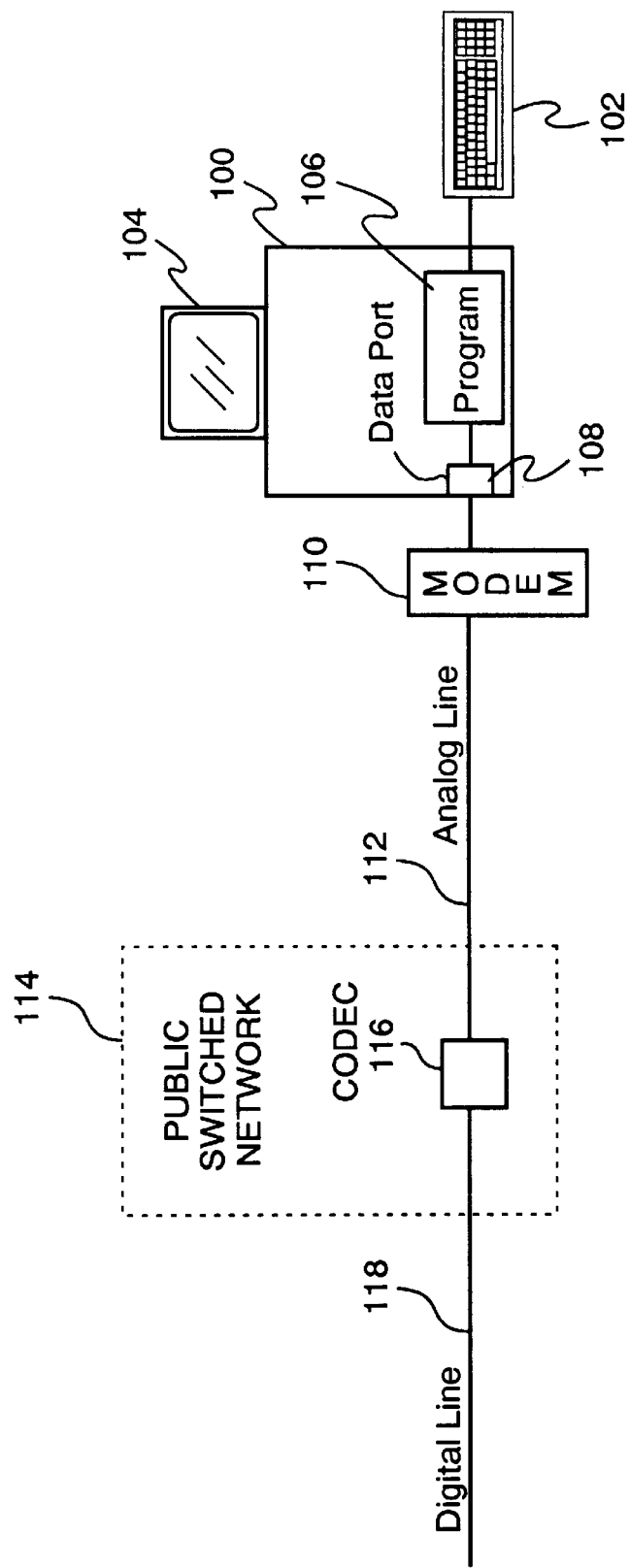
FIG. 1 is a functional block diagram illustrating the equipment currently necessary for a computer attached to an analog telecommunication line to send and receive application data over a public switched network.

After the public switched network 416 receives the encoded digital data, the data can be transmitted out of the public switched network 416 using either a second digital telecommunications line or an analog telecommunications line with an attached CODEC as illustrated in FIG. 1.

The control logic 408 of the present invention consists of computer software which is capable of converting encoded digital data describing analog signals representing digital application data directly into the digital application data using standard mathematical calculations and algorithms. The method utilized to perform this conversion depends on many factors.

Prior to converting the encoded digital data, the control logic 408 must determine the method used to originally convert the digital application data into analog signals. The control logic 408 must also determine the method used to describe the analog signals using encoded digital data (i.e. the Mu Law, ADPCM, or the A Law). The control logic 408 must further identify any distortion caused by the original conversion methods or by the hardware.

The determinations required of the control logic 408 can be determined by making assumptions and by analyzing the three components of a wave form: the frequency, phase and amplitude. Once the parameters of the conversions have been identified, the control logic 408 utilizes standard mathematical calculations such as the Fourier Transform and the Fast Fourrier Transform to convert the encoded digital data into the digital application data. Other formulae which prove useful in such conversions are described in the Texas Instrument Technical Application Notes for the TMS320 Family of DSPs.

Although methods of converting encoded digital data into digital application data are known, such methods have been limited to specific algorithms used in conjunction with specific hardware. The control logic 408 of the present invention is not so limiting.

Furthermore, the control logic 408 of the present invention does not need to be separate from the program 406 or the terminal adapter 410. Alternative embodiments might include an implementation in which the control logic 408 is incorporated with the terminal adapter 410 or an implementation in which the control logic 408 is incorporated with the program 406.

Figure 5:
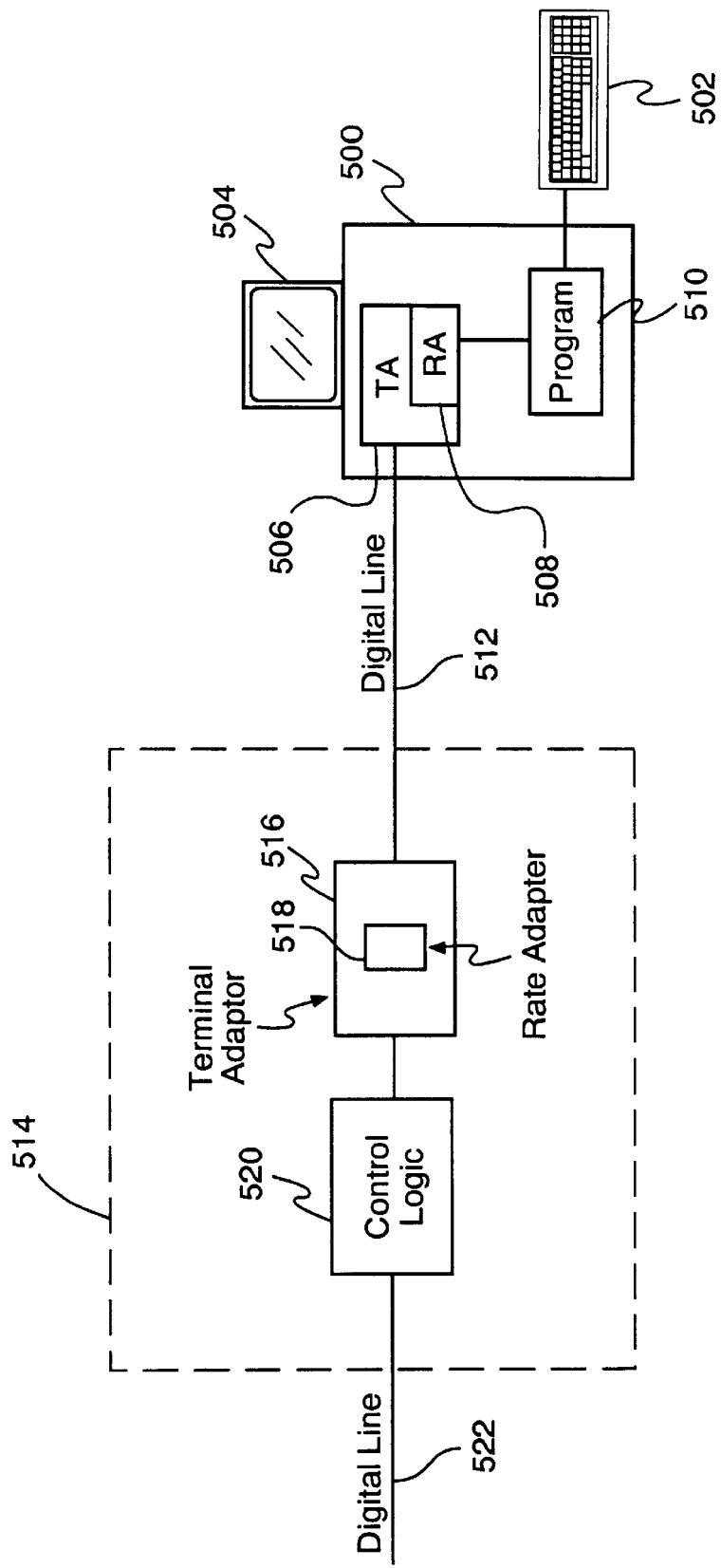
FIG. 5 is a functional block diagram illustrating an implementation of the present invention in a public switched network.

FIG. 5 is a functional block diagram describing the second example and illustrates an implementation of the present invention in a public switched network.

In FIG. 5, a computer 500, having a keyboard 502, a monitor 504, a terminal adapter 506 with an attached rate adapter 508 and a program 510 capable of communicating with terminal adapter 506 is attached to a first digital telecommunication line 512. The digital telecommunication line 512 is connected to a public switched network 514.

The public switched network 514 includes a terminal adapter 516 with an attached rate adapter 518, control logic 520 and a second digital telecommunication line 522.

Application data to be transmitted from the computer 500 through the digital telecommunication line 522 is first passed from the program 510 through the terminal adapter 506 and attached rate adapter 508 to the first digital telecommunication line 512. The digital data transmitted along the digital telecommunication line 512 is in a digital format adapted to flow at a rate compatible with both rate adapter 518 and rate adapter 508.

The digital data is received by the public switched network 514 and transmitted to terminal adapter 516 having rate adapter 518. Terminal adapter 516 utilizing rate adapter 518 converts the rate adapted digital data into digital data typically transmitted through an analog MODEM.

The digital data typically transmitted through an analog MODEM is transmitted from terminal adapter 516 to the control logic 520 which converts the digital data into encoded digital data describing analog signals representing digital application data. The encoded digital data is then transmitted out of the public switched network 514 along digital telecommunication line 522.

Although the example illustrated in FIG. 5 includes rate adapters 518 and 508, these are not necessary for the successful implementation of the present invention and are included only to more accurately describe the best mode.

Furthermore, as in FIG. 4, the control logic 520 of the present invention does not need to be separate from the terminal adapter 516. An implementation in which the control logic 520 is incorporated with the terminal adapter 516 is also possible.

It should be understood that the present invention is not limited to the hardware configuration or transmission direction of the above examples. The invention, for example, using the same hardware, will also facilitate data transmissions in the opposite direction.

In addition, FIGS. 4 and 5 represent only two of many possible equipment configurations. It should be understood that a computer or public switched network used in conjunction with the described control logic would facilitate data communications with a number of different types of hardware, including another computer, and the implementation of the present invention is not limited to this specific example.

While the best mode for carrying out the invention has been described in detail, those familiar with the art to which this invention relates will recognize various alternative designs and embodiments for practicing the invention as defined by the following claims.

What is claimed is:

1. A computer comprising control logic for directly transforming information between a digital format for application data used by the computer and a digital format for transmission through a digital telecommunication line, the transformation comprising a digital encoding of an analog representation of the application data wherein the control logic is operative to:
    (a) determine a method used to convert digital application data into analog signals represented by received information,
    (b) determine a method used to digitally encode the analog signals, and
    (c) identify distortion.

2. A computer comprising control logic as in claim 1 wherein the method used to digitally encode the analog signals comprised Mu law encoding.

3. A computer comprising control logic as in claim 1 wherein the method used to digitally encode the analog signals comprised A law encoding.

4. A computer comprising control logic as in claim 1 wherein the method used to digitally encode the analog signals comprised ADPCM encoding.

5. A computer comprising control logic as in claim 1 wherein the control logic analyzes the frequency, phase, and amplitude of analog signals represented by received information.

6. A computer comprising control logic as in claim 1 wherein the control logic is incorporated with a terminal adapter.

7. A computer comprising control logic as in claim 1 wherein the control logic is incorporated with the at least one program executing on the computer.

8. A computer comprising control logic as in claim 1 wherein the digital encoding of an analog representation of the application data is the equivalent of information produced by passing the application data through a MODEM and a CODEC.

9. A system for use within a computer for converting information between digital formats comprising:
    a terminal adapter interfacing the computer with a telecommunications line; and
    control logic in communication with the terminal adapter, the control logic operative to directly convert information between a digital application data format and a digital encoded data format, wherein information in the digital application data format is usable by at least one program on the computer, wherein information in the digital encoded format is a digital representation of analog signals carrying the application data and wherein the control logic is operative to determine a method used to convert digital application data into analog signals represented by received information, determine a method used to digitally encode the analog signals and identify distortion.

10. A system for use within a computer for converting information between digital formats as in claim 9 wherein the method used to digitally encode the analog signals comprised Mu law encoding.

11. A system for use within a computer for converting information between digital formats as in claim 9 wherein the method used to digitally encode the analog signals comprised A law encoding.

12. A system for use within a computer for converting information between digital formats as in claim 9 wherein the method used to digitally encode the analog signals comprised ADPCM encoding.

13. A system for use within a computer for converting information between digital formats as in claim 9 wherein the control logic analyzes the frequency, phase, and amplitude of analog signals represented by received information.

14. A system for use within a computer for converting information between digital formats as in claim 9 wherein the control logic is incorporated with the terminal adapter.

15. A system for use within a computer for converting information between digital formats as in claim 9 wherein the control logic is incorporated with the at least one program.

16. A system for use within a computer for converting information between digital formats as in claim 9 wherein the digital representation of analog signals is the equivalent of information produced by passing the application data through a MODEM and a CODEC.

* * * * *